US 6,586,873 B2
Jul. 1, 2003

(12) United States Patent
Mizutani et al.

(10) Patent No.: US 6,586,873 B2
(45) Date of Patent: Jul. 1, 2003

(54) DISPLAY PANEL MODULE WITH IMPROVED BONDING STRUCTURE AND METHOD OF FORMING THE SAME

(75) Inventors: Kazuhiro Mizutani, Tokyo (JP); Eiichi Kitazume, Tokyo (JP)

(73) Assignee: NEC Corporation, Tokyo (JP)

( * ) Notice: Subject to any disclaimer, the term of this patent is extended or adjusted under 35 U.S.C. 154(b) by 78 days.

(21) Appl. No.: 09/839,118

(22) Filed: Apr. 23, 2001

(65) Prior Publication Data
US 2001/0033127 A1 Oct. 25, 2001

(30) Foreign Application Priority Data

Apr. 24, 2000 (JP) .......................................... 2000-121919

(51) Int. Cl.[7] .................................................. H01J 1/88
(52) U.S. Cl. ........................ 313/495; 313/292; 313/496; 313/497
(58) Field of Search ................................ 313/238, 283, 313/286, 288, 292, 585, 586, 587, 495, 496, 497; 349/149, 150, 152; 345/905, 55

(56) References Cited

U.S. PATENT DOCUMENTS

| 5,182,489 A | * | 1/1993 | Sano ........................... 313/485 |
| 5,561,443 A | * | 10/1996 | Disanto et al. ............. 345/107 |
| 5,576,597 A | * | 11/1996 | Reynolds ..................... 313/582 |
| 6,043,605 A | * | 3/2000 | Paek ............................ 313/586 |
| 6,075,319 A | * | 6/2000 | Kanda et al. ................ 313/584 |
| 6,288,483 B1 | * | 9/2001 | Haven et al. ................ 313/461 |
| 6,329,752 B1 | * | 12/2001 | Choi ............................ 313/585 |
| 6,380,671 B1 | * | 4/2002 | Lee .............................. 313/495 |
| 6,411,043 B1 | * | 4/2002 | Jeong et al. ............. 315/169.3 |
| 6,384,531 B1 | * | 5/2002 | Park et al. .................. 313/584 |
| 6,411,033 B1 | * | 6/2002 | Mori et al. .................. 313/582 |
| 6,420,826 B1 | * | 7/2002 | Jankowski et al. ......... 313/495 |
| 6,437,505 B1 | * | 8/2002 | Baret et al. ................. 313/582 |

* cited by examiner

Primary Examiner—David Martin
Assistant Examiner—Dameon E. Levi
(74) Attorney, Agent, or Firm—Young & Thompson

(57) ABSTRACT

A display panel module includes a substrate, a circuit board, electrode terminals aligned in a first direction over a surface of the substrate, each of the electrode terminals extending in a second direction perpendicular to the first direction, lead terminals aligned in the first direction over a confronting surface of the circuit board to the substrate, at least an anisotropically conductive film sandwiched between the electrode terminals and the lead terminals, and a plurality of first electrically insulating walls on the substrate in at least selected plural ones of gaps between selected ones of the electrode terminals and on opposite side regions of the module, the opposite side regions being distanced in the first direction and separated by a center region. The first electrically insulating walls have a first height that is higher than a first total height of the electrode terminals and the anisotropically conductive film.

32 Claims, 14 Drawing Sheets

Short circuit

DISPLAY PANEL MODULE WITH IMPROVED BONDING STRUCTURE AND METHOD OF FORMING THE SAME

BACKGROUND OF THE INVENTION

1. Field of the Invention

The present invention relates to a display panel module and a method of forming the same, and more particularly to a display panel module having an improved connection structure between a display panel and a circuit board and a method of forming the same.

2. Description of the Related Art

Flat display panels of various types such as liquid crystal display panels, plasma display panels and electroluminescent display panels have been well-known to persons skilled in the above-described field. Such a display panel comprises an insulating substrate which has electrode terminals. The display panel forms a display panel module in combination with a flexible printed circuit board for driving the display panel. The display panel and the circuit board are electrically connected to each other through the following connection structure.

The display panel has electrode terminals. The circuit board has lead terminals. The display panel and the circuit board sandwich an anisotropically conductive sheet, so that the electrode terminals and the lead terminals are spatially separated by the anisotropically conductive sheet but electrically connected to each other through the sheet. Japanese Patent No. 2964730 discloses a plasma display panel having such a connection structure.

FIG. 1 is a fragmentary cross sectional elevation view of a plasma display panel module with a conventional connection structure. The plasma display panel module comprises a plasma display panel and a flexible printed circuit board 5. The plasma display panel has a supporting substrate 1 which has a surface, on which electrode terminals 2 and insulating barrier layers 12 are provided, wherein adjacent two of the electrode terminals 2 are separated by the insulating barrier layer 12. The electrode terminals 2 has a lower height than the insulating barrier layer 12. The flexible printed circuit board 5 has a surface having an alignment of lead terminals 6 which are positioned in correspondence with the electrode terminals 2.

The plasma display panel and the circuit board 5 sandwich an anisotropically conductive film 4 which has conductive particles 15, so that the electrode terminals 2 and the corresponding lead terminals 6 are spatially separated by the anisotropically conductive film 4 but electrically connected to each other through the conductive particles 15 in the anisotropically conductive film 4. Since adjacent two of the conductive particles 15 are separated, the anisotropically conductive film 4 is conductive in a film thickness direction but insulative in an in-plane direction. For this reason, adjacent two of the electrode terminals 2 are electrically isolated and other adjacent two of the lead terminals 6 are also isolated.

The electrode terminals 2 are made of silver. The insulating baffler layers 12 are provided for preventing that the electrical isolation between the adjacent two of the electrode terminals 2 is deteriorated by silver migration upon a heat treatment which is carried out for a thermal compression bonding process for bonding the substrate 1 and the circuit board 5 through the film 4. Assuming that the above insulating barrier layers 12 are not provided, then the silver migration may be caused via a migration path of a binder for the material of the film 4, wherein the migration path is present at a gap between the adjacent two of the electrode terminals 2.

Advanced displays have narrowed alignment-pitches of the electrode terminals and the lead terminals. Narrowing such alignment-pitches causes such an inter-electrode migration easily. The provision of the above insulating barrier layers 12 is effective to suppress the migration. The inter-electrode migration causes a short circuit between the electrode terminals. Such a migration is gradually caused during a long term operation of the display. The reason for the short circuit between the electrode terminals is not only the migration but also other factors on the manufacturing processes.

One of the other reasons is a difference in thermal expansion coefficient between the substrate 1 and the flexible printed circuit board 5. As described above, the substrate 1 and the flexible printed circuit board 5 are bonded through the anisotropically conductive film 4 by the thermal compression bonding process. The flexible printed circuit board 5 is made of an organic material such as polyimide which has a thermal extension coefficient of about $26\times10^{-6}/°C$. The supporting substrate 1 is made of a transparent glass material which has a thermal extension coefficient of about $5\times10^{-6}/°C$. Namely, the flexible printed circuit board 5 has a higher thermal extension coefficient by approximate five times than the supporting substrate 1.

Upon receipt of the heat in the thermal compression bonding process, the flexible printed circuit board 5 shows a larger expansion than the supporting substrate 1. FIG. 2 is a fragmentary perspective view of the display panel module after the thermal compression bonding process, wherein the electrode terminals of the substrate and the lead terminals of the circuit board have become misaligned due to those difference in thermal expansion coefficient. Before the thermal compression bonding process, the electrode terminals of the substrate and the lead terminals of the circuit board are just aligned. The thermal compression bonding process causes the substrate and the circuit board to show different thermal expansions, whereby the electrode terminals of the substrate and the lead terminals of the circuit board become different in pitch, resulting in a misalignment between them. The degree of the misalignment is larger at the opposite end portions than the center portion. A large relative displacement between the electrode terminals and the lead terminals causes a short circuit, wherein adjacent two of the electrode terminals are electrically connected to each other through the lead terminal having both edges in contact with edges of the adjacent two electrode terminals. Narrowing the terminal pitch reduces such a critical relative displacement, which causes the short circuit. Increasing the number of the terminals increases the relative displacement at the opposite end portions. The advanced display module has the serious problem with the short circuit formation.

Japanese laid-open patent publication No. 5-249479 discloses the following conventional technique for avoiding such a short circuit formation between the terminals. FIG. 3 is a schematic perspective view of a flexible printed circuit board with a single slit at a center. The flexible printed circuit board 5 has a single slit 14 at a center position. The flexible printed circuit board 5 also has a surface on which plural lead terminals 6 are aligned. The single slit 14 extends in parallel to a longitudinal direction of the lead terminals 6 and in perpendicular to an alignment direction of the lead terminals 6. The slit 14 reduces a thermal expansion of the circuit board 5 in the alignment direction. The slit 14 makes it necessary to do plural times alignment processes, thereby dropping the productivity of the display panel module. The formation of the slit 14 causes the increase of the manufacturing cost. The slit 14 weakens the mechanical strength of the circuit board 5, thereby reducing the reliability of the display panel module.

In the above circumstances, it had been required to develop a novel display panel module and method of forming the same free from the above problem.

SUMMARY OF THE INVENTION

Accordingly, it is an object of the present invention to provide a novel display panel module free from the above problems.

It is a further object of the present invention to provide a novel bonding structure between a display panel and a circuit board free from the above problems.

It is a still further object of the present invention to provide a novel method of forming a display panel module free from the above problems.

It is yet a further object of the present invention to provide a novel method of bonding a display panel and a circuit board free from the above problems.

A first aspect of the present invention is a display panel module comprising: a substrate; a circuit board; electrode terminals aligned in a first direction over a surface of the substrate, each of the electrode terminals extending in a second direction perpendicular to the first direction; lead terminals aligned in the first direction over a confronting surface of the circuit board to the substrate; at least an anisotropically conductive film sandwiched between the electrode terminals and the lead terminals; and a plurality of first electrically insulating walls provided on the substrate and positioned in at least selected plural ones of gaps between selected ones of the electrode terminals, and the selected ones of the electrode terminals being positioned on opposite side regions of the module, and the opposite side regions are distanced in the first direction and separated by a center region, wherein the first electrically insulating walls have a first height, which is higher than a first total height of the electrode terminals and the anisotropically conductive film.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DETAILED DESCRIPTION

Figure 1:
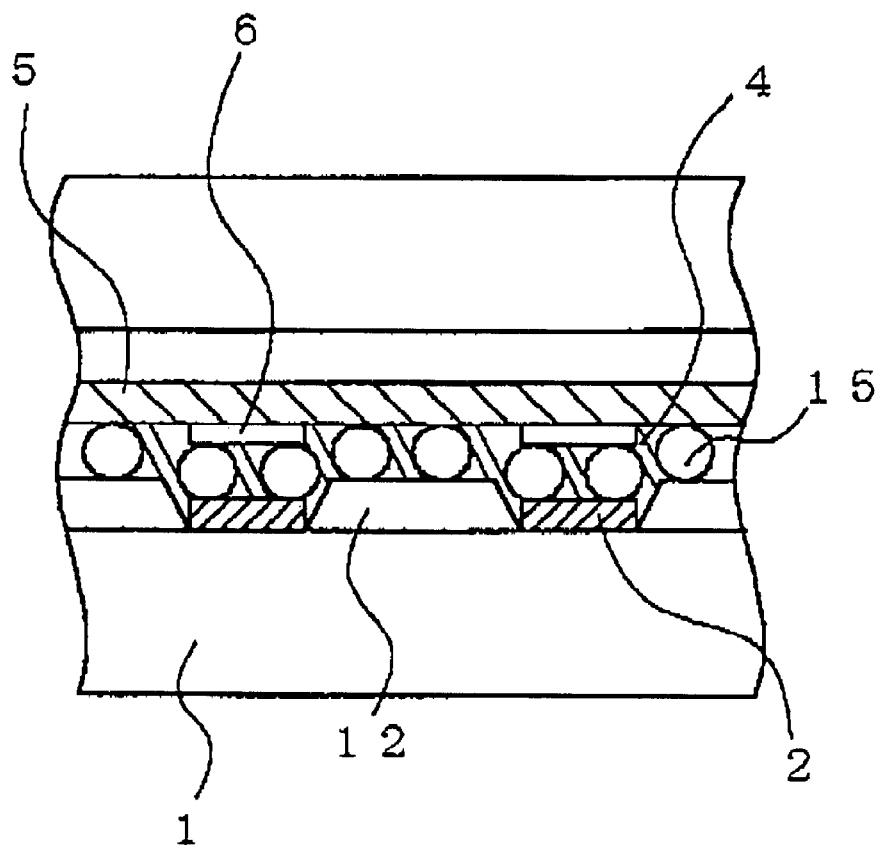
FIG. 1 is a fragmentary cross sectional elevation view of a plasma display panel module with a conventional connection structure.
Figure 2:
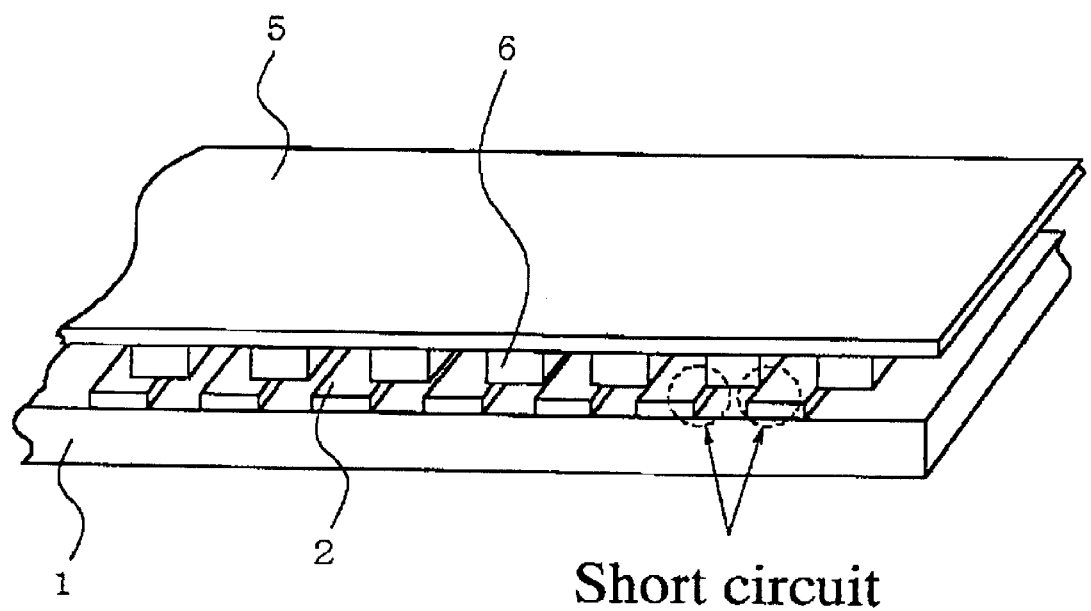
FIG. 2 is a fragmentary perspective view of the display panel module after the thermal compression bonding process, wherein the electrode terminals of the substrate and the lead terminals of the circuit board have become misaligned due to those difference in thermal expansion coefficient.
Figure 3:
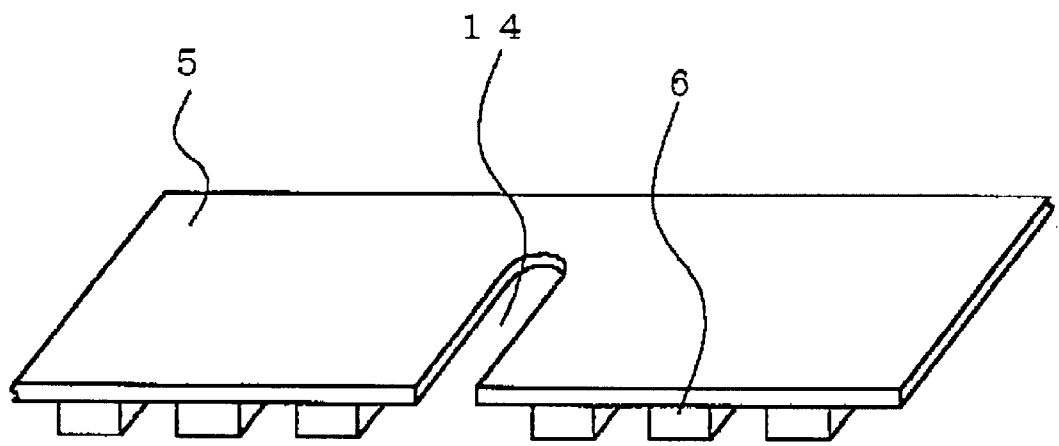
FIG. 3 is a schematic perspective view of a flexible printed circuit board with a single slit at a center.

A first aspect of the present invention is a display panel module comprising a substrate; a circuit board; electrode terminals aligned in a first direction over a surface of the substrate, each of the electrode terminals extending in a second direction perpendicular to the first direction; lead terminals aligned in the first direction over a confronting surface of the circuit board to the substrate; at least an anisotropically conductive film sandwiched between the electrode terminals and the lead terminals; and a plurality of first electrically insulating walls on the substrate in at least selected plural ones of gaps between selected ones of the electrode terminals and on opposite side regions of the module, where the opposite side regions are distanced in the first direction and separated by a center region, wherein the first electrically insulating walls have a first height, which is higher than a first total height of the electrode terminals and the anisotropically conductive film.

It is preferable that the first height of the first electrically insulating walls is lower than a second total height of the electrode terminals, the lead terminals and the anisotropically conductive film, so that a top surface of the first electrically insulating wall is not in contact with the confronting surface of the circuit board.

It is also preferable that the first electrically insulating walls are provided in all gaps between the electrode terminals on the opposite side regions.

It is further preferable that the first electrically insulating walls are provided in all gaps between all the electrode terminals over entire regions of the module.

It is also preferable, that the anisotropically conductive film extends entirely in the first direction and selectively in the second direction, so that the first electrically insulating walls are distanced from the anisotropically conductive film in the second direction, and top surfaces of the first electrically insulating walls are not in contact with the anisotropically conductive film.

It is also preferable that the anisotropically conductive film extends entirely in the first and second directions, and top surfaces of the first electrically insulating walls are in contact with the anisotropically conductive film.

It is also preferable that each of the first electrically insulating walls is distanced from confronting side edges of adjacent two of the electrode terminals.

It is also preferable that each of the first electrically insulating walls is in contact with confronting side edges of adjacent two of the electrode terminals.

It is also preferable that the first electrically insulating walls comprise dry resist films.

It is also preferable that the first electrically insulating walls comprise a solidified-paste insulating material.

It is also preferable to further comprise a plurality of second electrically insulating walls provided on the circuit board and positioned in selected gaps between the lead terminals, wherein the selected gaps between the lead terminals are different from confronting gaps to the first electrically insulating walls, and the second electrically insulating walls have a second height, which is higher than a third total height of the lead terminals and the anisotropically conductive film.

It is also preferable that the second height of the second electrically insulating walls is lower than a second total height of the electrode terminals, the lead terminals and the anisotropically conductive film, so that a top surface of the second electrically insulating wall is not in contact with the surface of the substrate.

It is also preferable that each of the second electrically insulating walls is distanced from confronting side edges of adjacent two of the lead terminals.

It is also preferable that each of the second electrically insulating walls is in contact with confronting side edges of adjacent two of the lead terminals.

It is also preferable that the second electrically insulating walls comprise dry resist films.

It is also preferable that the second electrically insulating walls comprise a solidified-paste insulating material.

A second aspect of the present invention is a display panel module comprising a substrate; a circuit board; electrode terminals aligned in a first direction over a surface of the substrate, each of the electrode terminals extending in a second direction perpendicular to the first direction; lead terminals aligned in the first direction over a confronting surface of the circuit board to the substrate; at least an anisotropically conductive film sandwiched between the electrode terminals and the lead terminals; and a plurality of first electrically insulating walls on the circuit board in at least selected plural ones of gaps between selected ones of the lead terminals and on opposite side regions of the module, where the opposite side regions are distanced in the first direction and separated by a center region, wherein the first electrically insulating walls have a first height, which is higher than a first total height of the lead terminals and the anisotropically conductive film.

It is preferable that the first height of the first electrically insulating walls is lower than a second total height of the electrode terminals, the lead terminals and the anisotropically conductive film, so that a top surface of the first electrically insulating wall is not in contact with the surface of the substrate.

It is also preferable that the first electrically insulating walls are provided in all gaps between the lead terminals on the opposite side regions.

It is further preferable that the first electrically insulating walls are provided in all gaps between all the electrode terminals over entire regions of the module.

It is also preferable that the anisotropically conductive film extends entirely in the first direction and selectively in the second direction, so that the first electrically insulating walls are distanced from the anisotropically conductive film in the second direction, and top surfaces of the first electrically insulating walls are not in contact with the anisotropically conductive film.

It is also preferable that the anisotropically conductive film extends entirely in the first and second directions, and top surfaces of the first electrically insulating walls are in contact with the anisotropically conductive film.

It is also preferable that each of the first electrically insulating walls is distanced from confronting side edges of adjacent two of the lead terminals.

It is also preferable that each of the first electrically insulating walls is in contact with confronting side edges of adjacent two of the lead terminals.

It is also preferable that the first electrically insulating walls comprise dry resist films.

It is also preferable that the first electrically insulating walls comprise a solidified-paste insulating material.

It is also preferable to further comprise a plurality of second electrically insulating walls provided on the substrate and positioned in selected gaps between the electrode terminals, wherein the selected gaps between the electrode terminals are different from confronting gaps to the first electrically insulating walls, and the second electrically insulating walls have a second height, which is higher than a third total height of the electrode terminals and the anisotropically conductive film.

It is also preferable that the second height of the second electrically insulating walls is lower than a second total height of the electrode terminals, the lead terminals and the anisotropically conductive film, so that a top surface of the second electrically insulating wall is not in contact with the surface of the circuit board.

It is also preferable that each of the second electrically insulating walls is distanced from confronting side edges of adjacent two of the electrode terminals.

It is also preferable that each of the second electrically insulating walls is in contact with confronting side edges of adjacent two of the electrode terminals.

It is also preferable that the second electrically insulating walls comprise dry resist films.

It is also preferable that the second electrically insulating walls comprise a solidified-paste insulating material.

A third aspect of the present invention is a method of forming a display panel module, comprising the steps of: forming an alignment of electrode terminals in a first direction over a surface of a substrate, each of said electrode terminals extending in a second direction perpendicular to said first direction; forming electrically insulating walls in at least selected plural ones of gaps between selected ones of said electrode terminals on opposite side regions of said module, and said opposite side regions being distanced in said first direction and separated by a center region; forming at least an anisotropically conductive film over said electrode terminals; and bonding said electrode terminals through said anisotropically conductive film to lead terminals which are aligned in said first direction over a confronting surface of a circuit board to said substrate, wherein said electrically insulating walls have a first height, which is higher than a first total height of said electrode terminals and said anisotropically conductive film.

This third aspect of the present invention has the same characteristics described above in connection with the first aspect of the present invention.

PREFERRED EMBODIMENTS

Figure 4:
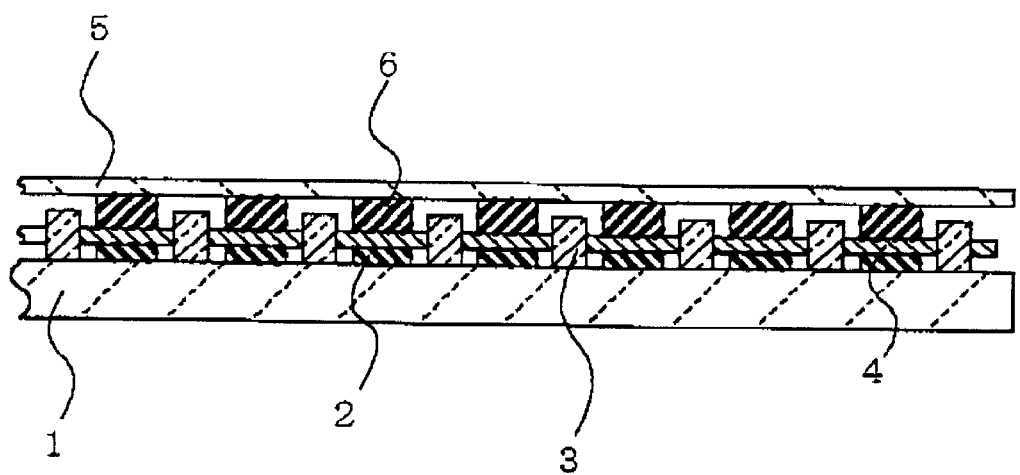
FIG. 4 is a fragmentary cross sectional elevation view of a display panel module with an improved bonding structure in a preferred embodiment of the present invention.
Figure 5:
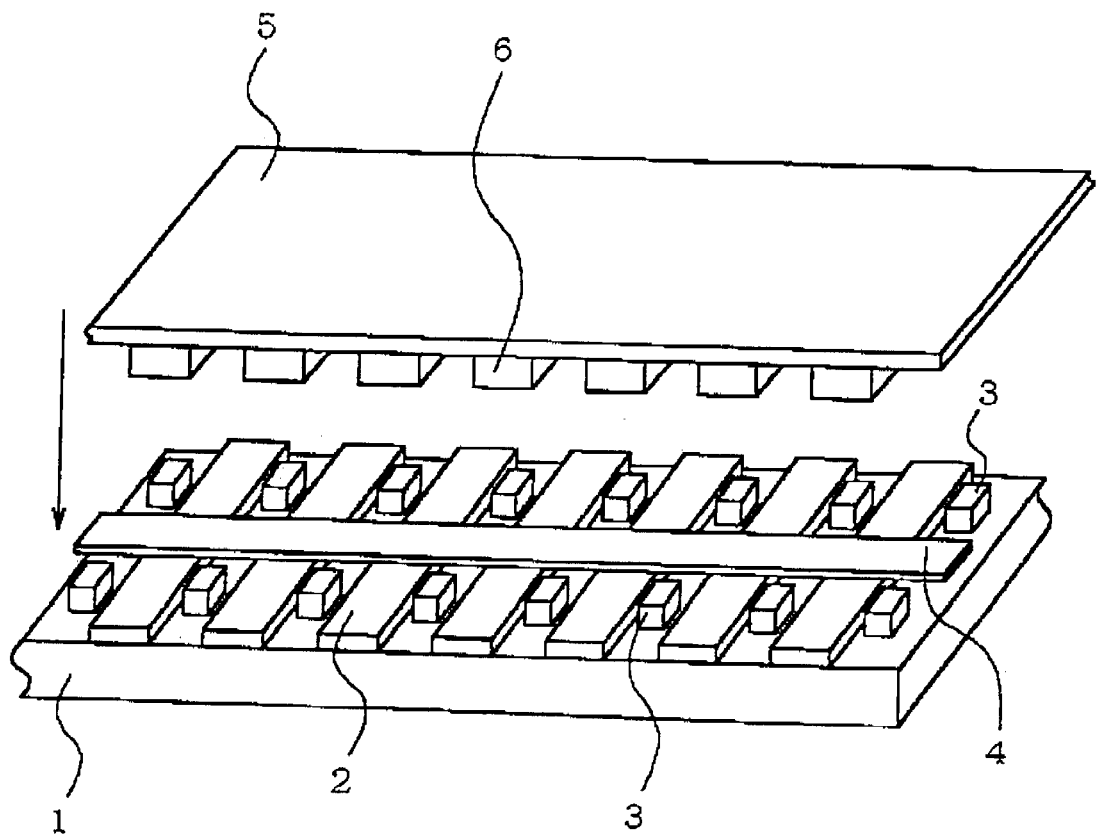
FIG. 5 is a fragmentary perspective view of a supporting substrate to be bonded to a flexible printed circuit board through an anisotropically conductive film in the form of a display panel module of FIG. 4.

A preferred embodiment according to the present invention will be described in detail with reference to the drawings. FIG. 4 is a fragmentary cross sectional elevation view of a display panel module with an improved bonding structure in a preferred embodiment of the present invention. FIG. 5 is a fragmentary perspective view of a supporting substrate to be bonded to a flexible printed circuit board through an anisotropically conductive film in the form of a display panel module of FIG. 4.

A display panel module has a supporting substrate 1 and a flexible printed circuit board 2. The supporting substrate 1 is transparent. The supporting substrate 1 has a thickness of 1.1 millimeters. Electrode terminals 2 are provided on a surface of the supporting substrate 1. The electrode terminals 2 are aligned at a constant pitch of 0.12 millimeters in a first direction which is parallel to a longitudinal direction of the supporting substrate 1 and the flexible printed circuit board 2. Each of the electrode terminals 2 has a stripe-shape having a longitudinal direction parallel to in a second direction perpendicular to the first direction. Each of the electrode terminals 2 has a width of 80 micrometers. 242 of the electrode terminals 2 are provided. The electrode terminals 2 are made of a transparent conductive material, for example, indium tin oxide. The electrode terminals 2 have a thickness of 100 nanometers.

Lead terminals 6 are provided on a confronting surface of the flexible printed circuit board 5 to the supporting substrate 1. The lead terminals 6 are aligned in the first direction at the same constant pitch as of the electrode terminals 2, so that the lead terminals 6 are positioned in correspondence with the electrode terminals 2. Each of the lead terminals 6 has a stripe-shape having a longitudinal direction parallel to in the second direction. Each of the lead terminals 6 has the same width as the electrode terminals 2. The same number of the lead terminals 6 as the electrode terminals 6 are provided. The lead terminals 2 have a thickness of 35 micrometers.

An anisotropically conductive film 4 is provided, which is sandwiched between the electrode terminals 2 and the lead terminals 6. The anisotropically conductive film 4 has a stripe-shape and a width of 2 millimeters. The anisotropically conductive film 4 has a thickness of 20 micrometers. The anisotropically conductive film 4 extends in the first direction along a longitudinal center line of the supporting substrate 1 and the flexible printed circuit board 5, so that center regions of all of the electrode terminals 2 and center regions of corresponding all of the lead terminals 6 sandwich the anisotropically conductive film 4.

Electrically insulating walls 3 are provided on the supporting substrate 1 and positioned in all gaps between the electrode terminals 2 aligned over the entire regions of the supporting substrate 1. As described above, the stripe-shaped anisotropically conductive film 4 with the width of 2 millimeters extends along the longitudinal center line of the supporting substrate 1 or the flexible printed circuit board 5. The anisotropically conductive film 4 overlies, on the longitudinal center region, the alternate-alignment of the electrode terminals 2 and the gaps between them. The anisotropically conductive film 4 does not overly opposite side regions of the longitudinal center region of the substrate 1. The electrically insulating walls 3 are provided in the gaps between the electrode terminals 2 but on the opposite side regions of the longitudinal center region of the substrate 1. In each of the gaps between the electrode terminals 2, a pair of the electrically insulating walls 3 are provided at opposite sides of the anisotropically conductive film 4. The paired electrically insulating walls 3 are distanced by 3 millimeters from each other in the second direction, so that the paired electrically insulating walls 3 are distanced from opposite side edges of the anisotropically conductive film 4 having the width of 2 millimeters.

Dual alignments of the electrically insulating walls 3 has the same pitch of the electrode terminals 2 and the lead terminals 6. Each of the electrically insulating walls 3 has a width of 20 micrometers and a length of 1 millimeters, wherein the width is a size in the first direction and the length is a size in the second direction. As described above, the pitch of the electrode terminals 2 is 120 micrometers, and the electrode terminals 2 have a width of 80 micrometers, for which reason the gap between adjacent two of the electrode terminals 2 has a width of 40 micrometers in the first direction. In the gap of 40 micrometers, each of the electrically insulating walls 3 of the width of 20 micrometers is provided, so that opposite side faces of each of the electrically insulating walls 3 are separated from confronting side faces of the adjacent two electrode terminals 2.

The electrically insulating walls 3 have a thickness or height of 25 micrometers. As described above, the thickness of the electrode terminals 2 is 0.1 micrometer. The thickness of the anisotropically conductive film 4 is 2.0 micrometers. The thickness of the lead terminals 6 is 35 micrometers. The top level of the electrically insulating walls 3 is higher by 23 micrometers than the top level of the anisotropically conductive film 4. Thus, the top surface of the electrically insulating walls 3 is distanced by 12 micrometers from the surface of the flexible printed circuit board 5. The top level of the electrically insulating walls 3 fixed on the supporting substrate 1 is higher by 23 micrometers than the bottom level of the lead terminals 6 fixed on the flexible printed circuit board 5.

The above supporting substrate 1 and the flexible printed circuit board 5 are bonded by a thermal compression bonding process. This thermal compression bonding process causes the substrate and the circuit board to show different thermal expansions. The electrically insulating walls 3 fixed on the supporting substrate 1 prevents a large relative displacement between the electrode terminals 2 and the lead terminals 6 upon receipt of a heat by the thermal compression bonding process. The relative displacement is strictly limited by the electrically insulating walls 3, thereby suppressing any short circuit between the adjacent two electrode terminals 2 and between the adjacent two lead terminals 6.

The electrically insulating walls 3 prevent such a short circuit even when the terminal pitch is narrowed and the number of the terminals is increased. The electrically insulating walls 3 make the advanced display module with the shortened pitch and the increased number of the terminals free from such a serious problem for the conventional display module.

A method of forming the above display panel module will subsequently be described. FIGS. 6A through 6E are fragmentary schematic views illustrative of a method of forming a display panel module in a preferred embodiment in accordance with the present invention.

Figure 6A:
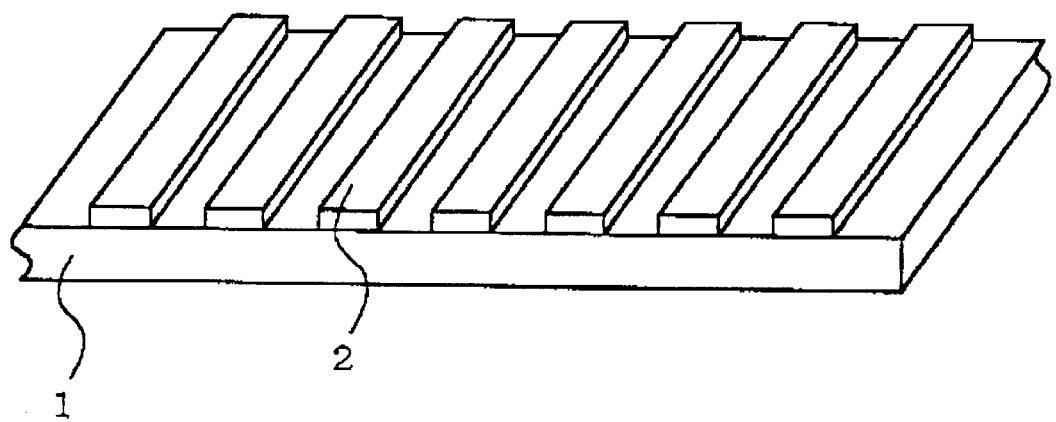
FIGS. 6A through 6E are fragmentary schematic views illustrative of a method of forming a display panel module in a preferred embodiment in accordance with the present invention.

With reference to FIG. 6A, an indium tin oxide film having a thickness of 100 nanometers is deposited by a sputtering method over a surface of the transparent supporting substrate 1 which has a thickness of 1.1 millimeters. The indium tin oxide film is selectively etched by a lithography technique to form 242 of stripe-shaped indium tin oxide electrode terminals 2 which are aligned at a constant pitch of 120 micrometers over the entire region of the substrate 1 in the first direction which is in parallel to the longitudinal direction of the substrate 1, wherein the electrode terminals 2 have a width of 80 micrometers which is a size in the first direction, and gaps between the electrode terminals 2 is 40 micrometers.

Figure 6B:
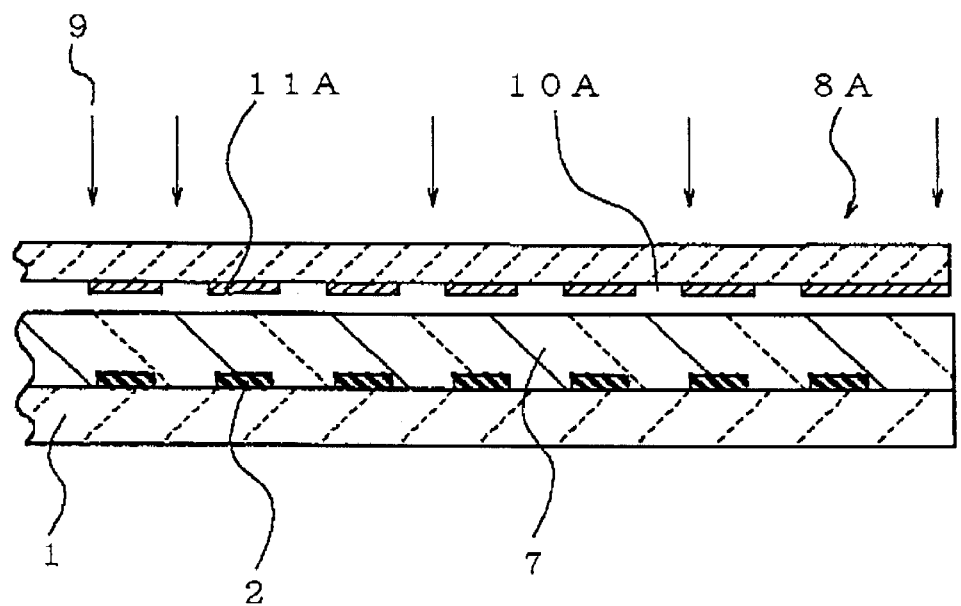

With reference to FIG. 6B, a negative dry resist film 7 having a thickness of 25 micrometers is adhered by a laminator over an entire region of the substrate 1 with the electrode terminals 2 under conditions of a temperature of 85–115° C., a pressure of 2–4 kg/cm$^2$, and a rate of 1–3 meters/minute. A photo-mask 8A is placed over the substrate 1 for irradiation of an ultraviolet ray 9 through the photo-mask 8A onto the negative dry resist film 7, wherein the ultraviolet ray 9 has a wavelength in the range of 350–450 nanometers.

Figure 7:
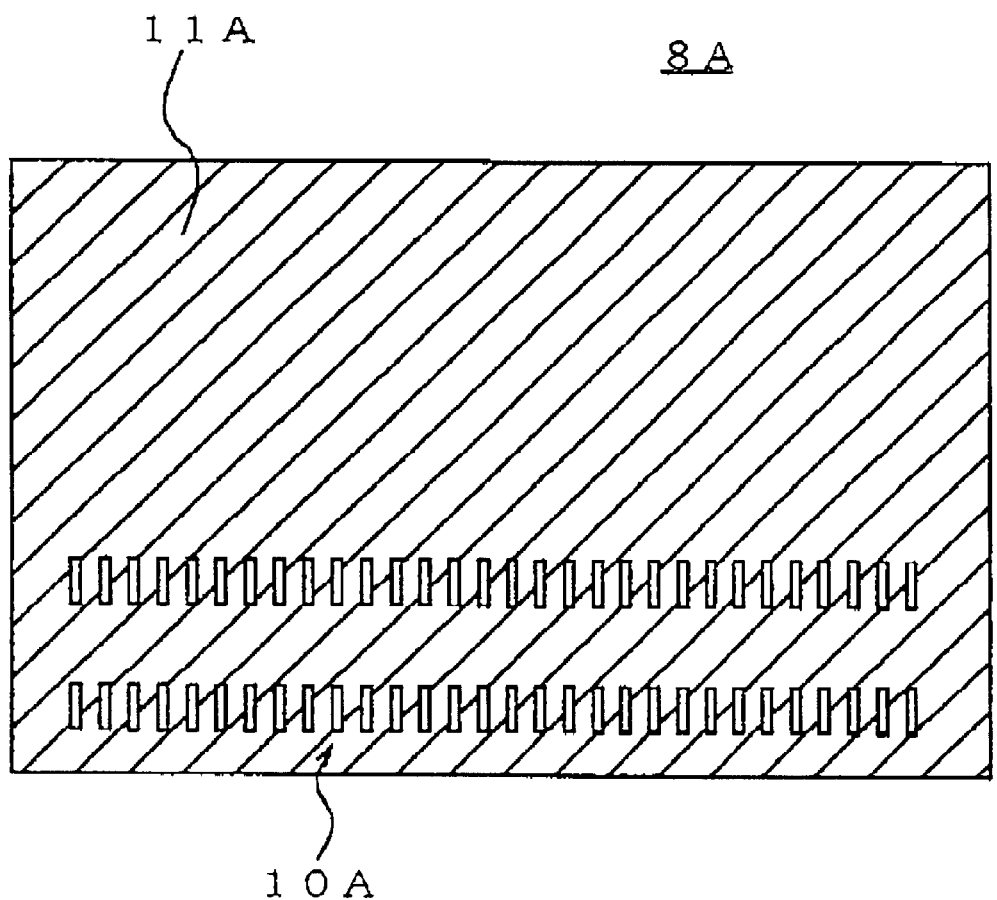
FIG. 7 is a plan view of a photo-mask with a light-shielding pattern and a light-transmitting pattern.

FIG. 7 is a plan view of a photo-mask with a light-shielding pattern and a light-transmitting pattern. The photo-mask 8A has a light-shielding pattern 11A and a light-transmitting pattern 10A. The photo-mask 8A comprises a transparent substrate with opaque patterns as the light-shielding pattern 11A and gaps between the light-transmitting pattern 10A as the light-transmitting pattern 10A. The light-transmitting pattern 10A comprises dual alignments of stripe-shaped slits aligned in the first direction, wherein the longitudinal direction of the stripe-shaped slits is in parallel to the second direction. The stripe-shaped slits are aligned at a constant pitch of 120 micrometers. The stripe-shaped slits have a width of 20 micrometers in the first direction and a length of 1 millimeter in the second direction. The dual alignments are distanced by 3 millimeters. When the photo-mask 8A is aligned over the substrate 1, the dual alignments of the stripe-shaped slits of the photo-mask 8A are positioned over the gaps between the electrode terminals 2. Each pair of the stripe-shaped slits of the photo-mask 8A is positioned over each gap between the electrode terminals 2.

The dry resist film 7 is exposed to the ultraviolet ray 9 transmitted through the stripe-shaped slits of the photo-mask 8A, whereby exposed parts of the dry resist film 7 become insoluble by a cross-linking reaction, whilst the remaining parts or the unexposed parts of the dry resist film 7 remains soluble. A development, and subsequent cleaning and dry processes are carried out to selectively remove the soluble unexposed parts of the dry resist film 7, whereby the insoluble exposed parts of the dry resist film 7 remain as electrically insulating walls 3 having the thickness of 25 micrometers. The development is carried out using a solution containing $Na_2CO_3$ at 0.8–1.2%. The cleaning process is carried out by a solution containing KOH at 2–4%. The dry process is carried out in a clean oven at 130° C. for 60 minutes.

Figure 6C:
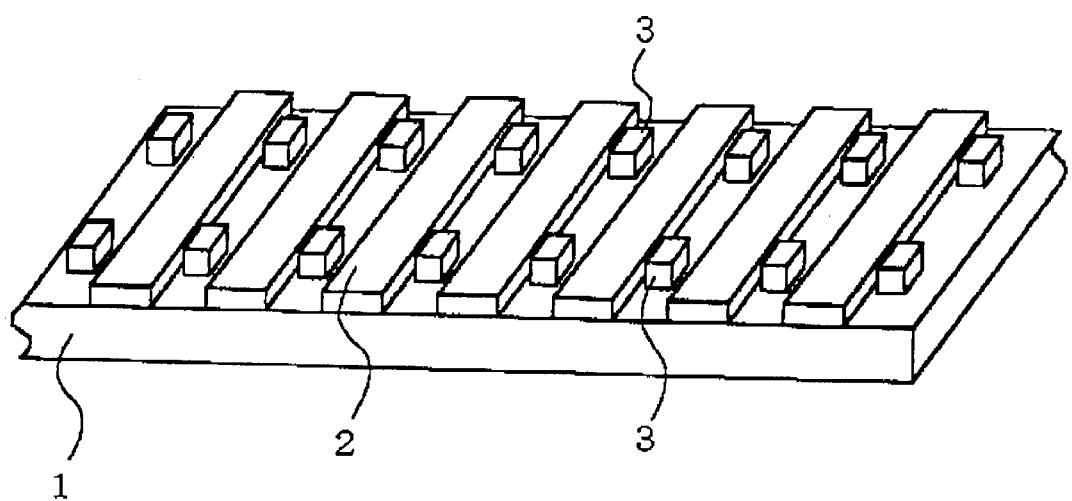

With reference to FIG. 6C, dual alignments of the electrically insulating walls 3 are formed, which have a distance of 3 millimeters.

Figure 6D:
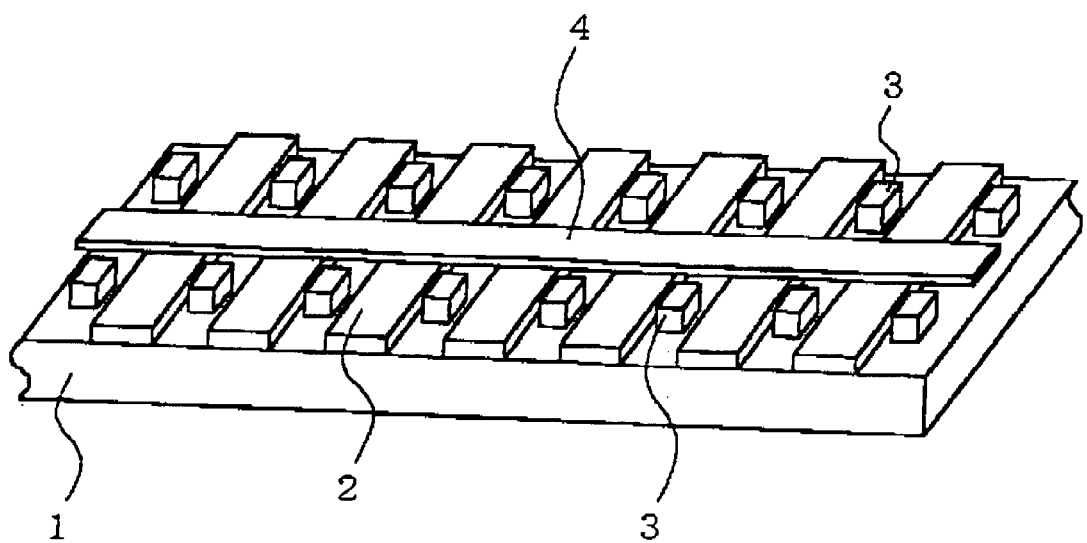

With reference to FIG. 6D, an anisotropically conductive film 4 having a thickness of 20 micrometers and a width of 2 millimeters is laminated along a longitudinal center axis of the substrate 1 and entirely in the first direction parallel to the longitudinal center axis, so that the anisotropically conductive film 4 overlies the electrode terminals 2 and these gaps and extends over the longitudinal center region between the dual alignments of the electrically insulating walls 3. The anisotropically conductive film 4 is fixed by a previous thermal compression using a heat tool under conditions of a temperature of 80° C., a pressure of 5 kg/cm$^2$, and a time duration of 5 seconds.

Figure 6E:
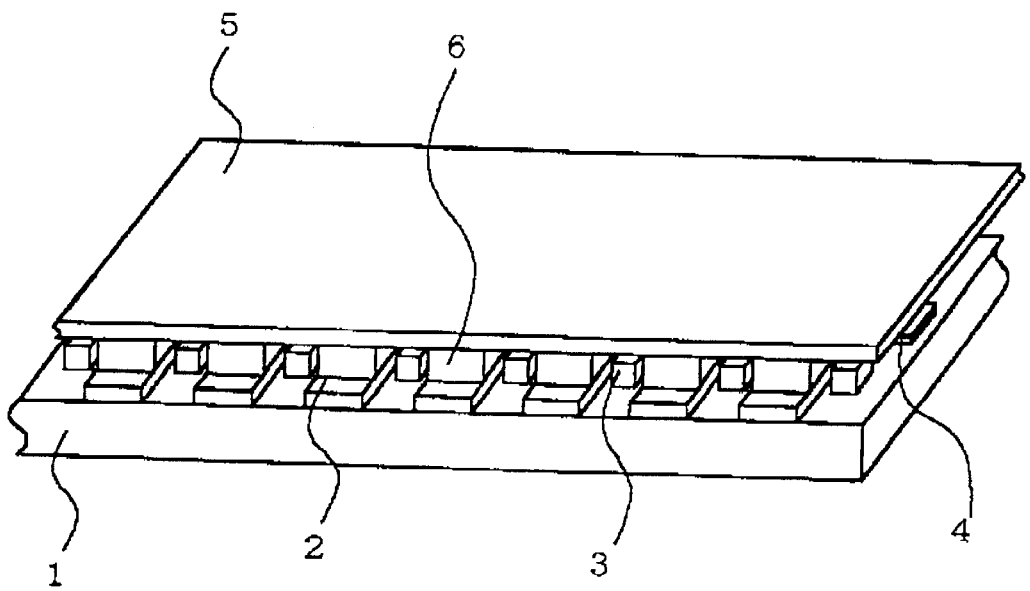

With reference to FIG. 6E, a flexible printed circuit board 5 with lead terminals 6 is prepared. The lead terminals 6 have a thickness of 35 micrometers. A separator is peeled from the anisotropically conductive film 4. The flexible printed circuit board 5 is placed over the supporting substrate 1, so that the lead terminals 6 are aligned to the electrode terminals 2, wherein the anisotropically conductive film 4 is sandwiched between the lead terminals 6 and the electrode terminals 2. The flexible printed circuit board 5 and the supporting substrate 1 are bonded to each other by a thermal compression bonding process using a heat tool under conditions of a temperature of 170° C., a pressure of 30 kg/cm$^2$, and a time duration of 20 seconds. The thickness of the anisotropically conductive film 4 is reduced from 20 micrometers into 2 micrometers. The lead terminals 6 and the electrode terminals 2 are electrically connected to each other through the anisotropically conductive film 4. The adjacent two electrode terminals 2 are electrically separated from each other. Also, the adjacent two lead terminals 6 are electrically separated from each other. As a result, the display panel module is formed.

Immediately after the above thermal compression bonding process, a bonding structure of the display panel module was observed by a microscope. All corresponding pairs of the lead terminals and the electrode terminals 2 are aligned without any substantive relative displacement due to difference in thermal expansion coefficient between the supporting substrate 1 and the flexible printed circuit board 5.

The above effect of provision of the electrically insulating walls 3 was confirmed by the above observation by the microscope. Namely, the electrically insulating walls 3 fixed on the supporting substrate 1 prevent a large relative displacement between the electrode terminals 2 and the lead terminals 6 upon receipt of a heat by the thermal compression bonding process. The relative displacement is strictly limited by the electrically insulating walls 3, thereby suppressing any short circuit between the adjacent two electrode terminals 2 and between the adjacent two lead terminals 6. The electrically insulating walls 3 prevent such a short circuit even when the terminal pitch is narrowed and the number of the terminals is increased. The electrically insulating walls 3 make the advanced display module with the shortened pitch and the increased number of the terminals free from such a serious problem for the conventional display module.

A contact resistance between each pair of the lead terminals 6 and the electrode terminals 2 was measured. The measured contact resistance was within a designed acceptable range. This means that the electrically insulating walls 3 provide no influence to the electrical connections between the lead terminals 6 and the electrode terminals through the anisotropically conductive film 4. As described above, the thickness of the electrically insulating walls 3 is 25 micrometers which is lower than a total thickness of the 0.1 micrometer thickness of the electrode terminals 2, the 2.0 micrometers thickness of the anisotropically conductive film 4, and the 35 micrometer thickness of the lead terminals 6. The electrically insulating walls 3 provide no influence to the depression of the anisotropically conductive film 4 in the thermal compression bonding process.

The anisotropically conductive film 4 has a binder. In the thermal compression bonding process, the binder is melt out from the film 4 when the anisotropically conductive film 4 is depressed between the lead terminals 6 and the electrode terminals 2, wherein the gaps under the anisotropically conductive film 4 serve as escape zones for the melt binder.

In accordance with the above descriptions, the electrically insulating walls 3 are provided in all gaps between the electrode terminals 2 which are aligned over the entire regions of the substrate 1. It is possible as a modification that the electrically insulating walls 3 are selectively provided on opposite side regions of the substrate 1, so that the electrically insulating walls 3 are positioned in selected gaps between the selected electrode terminals 2 on the opposite side regions of the substrate 1.

Figure 8:
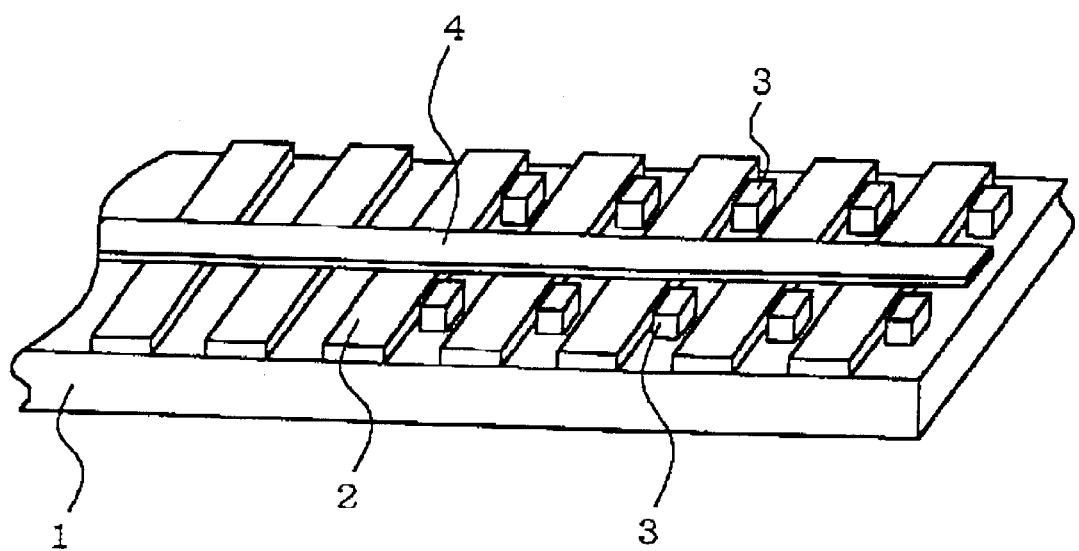
FIG. 8 is a fragmentary schematic view of a substrate with alignment of electrode terminals and electrically insulating walls in a modified preferred embodiment in accordance with the present invention.
Figure 9:
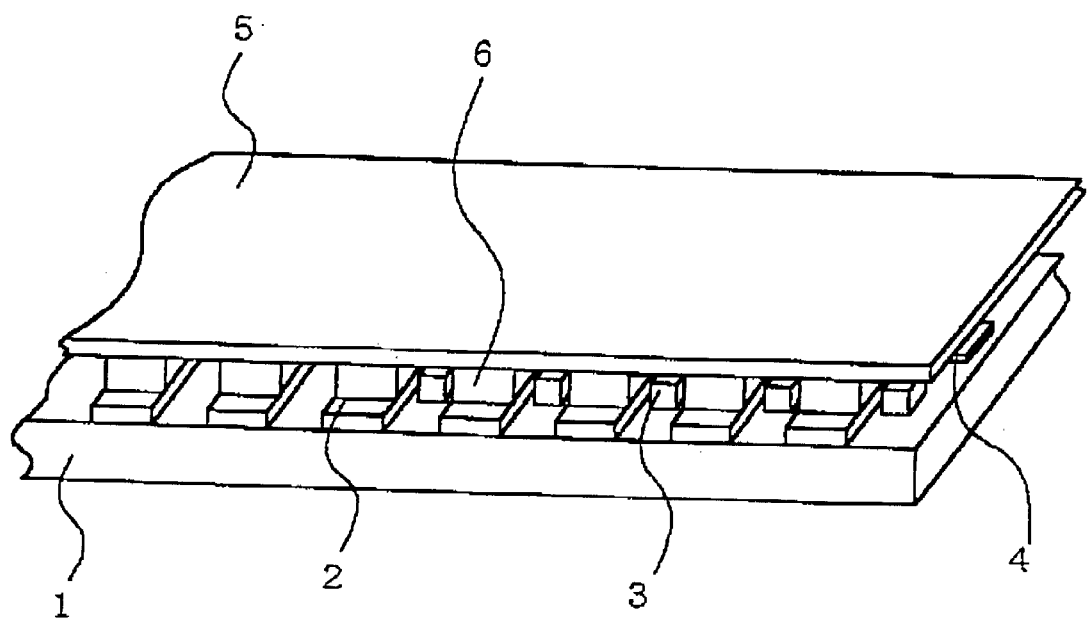
FIG. 9 is a fragmentary schematic view of a display panel module in a modified preferred embodiment in accordance with the present invention.

FIG. 8 is a fragmentary schematic view of a substrate with alignment of electrode terminals and electrically insulating walls in a modified preferred embodiment in accordance with the present invention. FIG. 9 is a fragmentary schematic view of a display panel module in a modified preferred embodiment in accordance with the present invention.

The electrically insulating walls 3 are positioned in selected gaps between the selected electrode terminals 2 on the opposite side regions of the substrate 1. The opposite side regions of the display panel module show larger relative displacements than the center region when the thermal compression bonding process is carried out. This means that the relative displacement between the electrode terminals 2 and the lead terminals 6 on the side regions of the module is large and it is important to suppress the relative displacement on the side regions of the module. In this viewpoint, the electrically insulating walls 3 are selectively positioned on the side regions of the module for preventing the large relative displacement between the electrode terminals 2 and the lead terminals 6 on the side regions of the module when the thermal compression bonding process is carried out.

Figure 10:
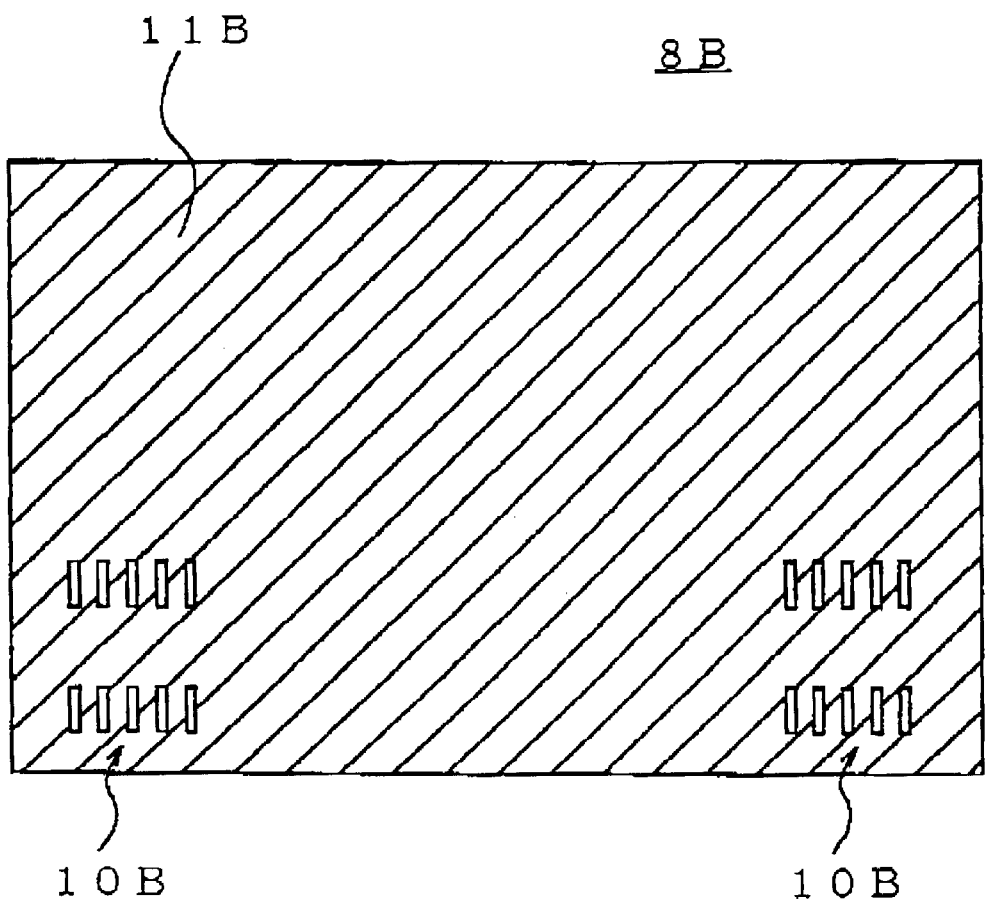
FIG. 10 is a plan view of a photo-mask for forming electrically insulating walls over a substrate of a display panel module of FIG. 8.

FIG. 10 is a plan view of a photo-mask for forming electrically insulating walls over a substrate of a display panel module of FIG. 8. The photo-mask 8B has a light-shielding pattern 11A and a light-transmitting pattern 10A. The photo-mask 8A comprises a transparent substrate with opaque patterns as the light-shielding pattern 11B and gaps between the light-transmitting pattern 10B as the light-transmitting pattern 10B. The light-transmitting pattern 10B comprises dual alignments of stripe-shaped slits aligned in the first direction, wherein the longitudinal direction of the stripe-shaped slits is in parallel to the second direction. The stripe-shaped slits are aligned at a constant pitch of 120 micrometers but only on the opposite side regions. The stripe-shaped slits have a width of 20 micrometers in the first direction and a length of 1 millimeter in the second direction. Two pairs of the dual alignments of the stripe-shaped slits are formed on opposite side regions. Each paired dual alignments are distanced by 3 millimeters. When the photo-mask 8B is aligned over the substrate 1, the dual alignments of the stripe-shaped slits of the photo-mask 8B are positioned over the gaps between the electrode terminals 2 on the opposite side regions. Each pair of the stripe-shaped slits of the photo-mask 8B is positioned over each gap between the electrode terminals 2.

In accordance with the above descriptions opposite side faces of each of the electrically insulating walls 3 are distanced from the confronting side faces of the adjacent two electrode terminals 2. It is possible as a modification that the width of the electrically insulating walls 3 is the same as the gap between the adjacent two electrode terminals 2 and between the adjacent two lead terminals 6, so that the opposite side faces of each of the electrically insulating walls 3 are in contact with the confronting side faces of the adjacent two electrode terminals 2, and also confronting side faces of the adjacent two lead terminals 6. The electrically insulating walls 3 fixed on the supporting substrate 1 prevents any relative displacement between the electrode terminals 2 and the lead terminals 6 upon receipt of a heat by the thermal compression bonding process. No relative displacement is allowed by the electrically insulating walls 3, thereby suppressing any short circuit between the adjacent two electrode terminals 2 and between the adjacent two lead terminals 6. The electrically insulating walls 3 prevent such a short circuit even when the terminal pitch is narrowed and the number of the terminals is increased. The electrically insulating walls 3 make the advanced display module with the shortened pitch and the increased number of the terminals free from such a serious problem for the conventional display module.

In accordance with the above descriptions, the above electrically insulating walls 3 comprise the dry resist films. It is possible as a modification that the above electrically insulating walls 3 comprise a solidified-paste insulating material such as a glass paste. The solidified paste insulating material may be applied by a screen printing method in the gaps between the electrode terminals 2 for subsequent solidifying process.

In accordance with the above descriptions, the electrically insulating walls 3 are distanced from the anisotropically conductive film 4 in the second direction, and top surfaces of the first electrically insulating walls are not in contact with the anisotropically conductive film 4. It is possible as a modification that the anisotropically conductive film 4 extends entirely in the first and second directions, so that the anisotropically conductive film 4 overlies the entire regions of the substrate 1 or the module, and top surfaces of the electrically insulating walls 3 are in contact with the anisotropically conductive film 4. As described above, the top level of the electrically insulating walls 3 is higher than the bottom level of the lead terminals 6. The anisotropically conductive film 4 has such a high flexibility as having a varying level between over the electrode terminals 2 and over the electrically insulating walls 3.

In accordance with the above descriptions, the electrically insulating walls 3 are provided fixedly on the supporting substrate 1. It is possible as a modification that electrically insulating walls 3 are provided on the flexible printed circuit board 5 and positioned in all gaps between the lead terminals 6 aligned over the entire regions of the flexible printed circuit board 5. The stripe-shaped anisotropically conductive film 4 with the width of 2 millimeters extends along the longitudinal center line of the flexible printed circuit board 5. The anisotropically conductive film 4 overlies, on the longitudinal center region, the alternate-alignment of the lead terminals 6 and the gaps between them. The anisotropically conductive film 4 does not overly opposite side regions of the longitudinal center region of the flexible printed circuit board 5. The electrically insulating walls 3 are provided in the gaps between the flexible printed circuit board 5 but on the opposite side regions of the longitudinal center region of the flexible printed circuit board 5. In each of the gaps between the lead terminals 6, a pair of the electrically insulating walls 3 are provided at opposite sides of the anisotropically conductive film 4. The paired electrically insulating walls 3 are distanced by 3 millimeters from each other in the second direction, so that the paired electrically insulating walls 3 are distanced from opposite side edges of the anisotropically conductive film 4 having the width of 2 millimeters.

Dual alignments of the electrically insulating walls 3 has the same pitch of the lead terminals 6 and the electrode terminals 2. Each of the electrically insulating walls 3 has the width of 20 micrometers and the length of 1 millimeters. As described above, the pitch of the lead terminals 6 is 120 micrometers, and the lead terminals 6 have a width of 80 micrometers, for which reason the gap between adjacent two of the lead terminals 6 has a width of 40 micrometers in the first direction. In the gap of 40 micrometers, each of the electrically insulating walls 3 of the width of 20 micrometers is provided, so that opposite side faces of each of the electrically insulating walls 3 are separated from confronting side faces of the adjacent two lead terminals 6.

The electrically insulating walls 3 have a thickness or height which is higher than the total thickness of the lead terminals 6 and the anisotropically conductive film 4, so that the bottom level of the electrically insulating walls 3 is lower than the top level of the electrode terminals 2.

The above supporting substrate 1 and the flexible printed circuit board 5 are bonded by a thermal compression bonding process. This thermal compression bonding process causes the substrate and the circuit board to show different thermal expansions. The electrically insulating walls 3 fixed on the flexible printed circuit board 5 prevents a large relative displacement between the lead terminals 6 and the electrode terminals 2 upon receipt of a heat by the thermal compression bonding process. The relative displacement is strictly limited by the electrically insulating walls 3, thereby suppressing any short circuit between the adjacent two lead terminals 6 and between the adjacent two electrode terminals 2.

The electrically insulating walls 3 prevent such a short circuit even when the terminal pitch is narrowed and the number of the terminals is increased. The electrically insulating walls 3 make the advanced display module with the shortened pitch and the increased number of the terminals free from such a serious problem for the conventional display module.

In accordance with the above modification, opposite side faces of each of the electrically insulating walls 3 are distanced from the confronting side faces of the adjacent two lead terminals 6. It is possible as a further modification that the width of the electrically insulating walls 3 is the same as the gap between the adjacent two lead terminals 6 and between the adjacent two electrode terminals 2, so that the opposite side faces of each of the electrically insulating walls 3 are in contact with the confronting side faces of the adjacent two lead terminals 6, and also the confronting side faces of the adjacent two electrode terminals 2. The electrically insulating walls 3 fixed on the flexible printed circuit board 5 prevent any relative displacement between the lead terminals 6 and the electrode terminals 2 upon receipt of a heat by the thermal compression bonding process. No relative displacement is allowed by the electrically insulating walls 3, thereby suppressing any short circuit between the adjacent two lead terminals 6 and between the adjacent two electrode terminals 2. The electrically insulating walls 3 prevent such a short circuit even when the terminal pitch is narrowed and the number of the terminals is increased. The electrically insulating walls 3 make the advanced display module with the shortened pitch and the increased number of the terminals free from such a serious problem for the conventional display module.

In accordance with the above modification, the electrically insulating walls 3 are distanced from the anisotropically conductive film 4 in the second direction, and top surfaces of the first electrically insulating walls are not in contact with the anisotropically conductive film 4. It is possible as a modification that the anisotropically conductive film 4 extends entirely in the first and second directions, so that the anisotropically conductive film 4 underlies the entire regions of the flexible printed circuit board 5, and bottom surfaces of the electrically insulating walls 3 are in contact with the anisotropically conductive film 4. As described above, the bottom level of the electrically insulating walls 3 is lower than the top level of the electrode terminals 2. The anisotropically conductive film 4 has such a high flexibility as having a varying level between under the lead terminals 6 and under the electrically insulating walls 3.

Needless to say, the above description present invention may be applied to any type display panel modules, for example, not only liquid crystal display panel module but also plasma display panel module and electroluminescent display panel module.

Although the invention has been described above in connection with several preferred embodiments therefor, it will be appreciated that those embodiments have been provided solely for illustrating the invention, and not in a limiting sense. Numerous modifications and substitutions of equivalent materials and techniques will be readily apparent to those skilled in the art after reading the present application, and all such modifications and substitutions are expressly understood to fall within the true scope and spirit of the appended claims.

What is claimed is:

1. A display panel module comprising:
   a substrate;
   a circuit board;
   electrode terminals aligned in a first direction over a surface of said substrate, each of said electrode terminals extending in a second direction perpendicular to said first direction;
   lead terminals aligned in said first direction over a confronting surface of said circuit board to said substrate;
   at least an anisotropically conductive film sandwiched between said electrode terminals and said lead terminals; and
   a plurality of first electrically insulating walls on said substrate in at least selected plural ones of gaps between selected ones of said electrode terminals and on opposite side regions of said module, wherein said opposite side regions are distanced in said first direction and separated by a center region,
   wherein said first electrically insulating walls have a first height, which is higher than a first total height of said electrode terminals and said anisotropically conductive film.

2. The module as claimed in claim 1, wherein said first height of said first electrically insulating walls is lower than a second total height of said electrode terminals said lead terminals and said anisotropically conductive film, so that a top surface of said first electrically insulating wall is not in contact with said confronting surface of said circuit board.

3. The module as claimed in claim 1, wherein said first electrically insulating walls are provided in all gaps between said electrode terminals on said opposite side regions.

4. The module as claimed in claim 3, wherein said first electrically insulating walls are provided in all gaps between all said electrode terminals over entire regions of said module.

5. The module as claimed in claim 1, wherein said anisotropically conductive film extends entirely in said first direction and selectively in said second direction, so that said first electrically insulating walls are distanced from said anisotropically conductive film in said second direction, and top surfaces of said first electrically insulating walls are not in contact with said anisotropically conductive film.

6. The module as claimed in claim 1, wherein said anisotropically conductive film extends entirely in said first and second directions, and top surfaces of said first electrically insulating walls are in contact with said anisotropically conductive film.

7. The module as claimed in claim 1, wherein each of said first electrically insulating walls is distanced from confronting side edges of adjacent two of said electrode terminals.

8. The module as claimed in claim 1, wherein each of said first electrically insulating walls is in contact with confronting side edges of adjacent two of said electrode terminals.

9. The module as claimed in claim 1, wherein said first electrically insulating walls comprise dry resist films.

10. The module as claimed in claim 1, wherein said first electrically insulating walls comprise a solidified-paste insulating material.

11. The module as claimed in claim 1, further comprising a plurality of second electrically insulating walls provided on said circuit board and positioned in selected gaps between said lead terminals, wherein said selected gaps between said lead terminals are different from confronting gaps to said first electrically insulating walls, and said second electrically insulating walls have a second height, which is higher than a third total height of said lead terminals and said anisotropically conductive film.

12. The module as claimed in claim 11, wherein said second height of said second electrically insulating walls is lower than a second total height of said electrode terminals, said lead terminals and said anisotropically conductive film, so that a top surface of said second electrically insulating wall is not in contact with said surface of said substrate.

13. The module as claimed in claim 11, wherein each of said second electrically insulating walls is distanced from confronting side edges of adjacent two of said lead terminals.

14. The module as claimed in claim 11, wherein each of said second electrically insulating walls is in contact with confronting side edges of adjacent two of said lead terminals.

15. The module as claimed in claim 11, wherein said second electrically insulating walls comprise dry resist films.

16. The module as claimed in claim 11, wherein said second electrically insulating walls comprise a solidified-paste insulating material.

17. A display panel module comprising:

a substrate;

a circuit board;

electrode terminals aligned in a first direction over a surface of said substrate, each of said electrode terminals extending in a second direction perpendicular to said first direction;

lead terminals aligned in said first direction over a confronting surface of said circuit board to said substrate;

at least an anisotropically conductive film sandwiched between said electrode terminals and said lead terminals; and a plurality of first electrically insulating walls on said circuit board in at least selected plural ones of gaps between selected ones of said lead terminals and on opposite side regions of said module, wherein said opposite side regions are distanced in said first direction and separated by a center region, wherein said first electrically insulating walls have a first height, which is higher than a first total height of said lead terminals and said anisotropically conductive film.

18. The module as claimed in claim 17, wherein said first height of said first electrically insulating walls is lower than a second total height of said electrode terminals, said lead terminals and said anisotropically conductive film, so that a top surface of said first electrically insulating wall is not in contact with said surface of said substrate.

19. The module as claimed in claim 17, wherein said first electrically insulating walls are provided in all gaps between said lead terminals on said opposite side regions.

20. The module as claimed in claim 19, wherein said first electrically insulating walls are provided in all gaps between all said electrode terminals over entire regions of said module.

21. The module as claimed in claim 17, wherein said anisotropically conductive film extends entirely in said first direction and selectively in said second direction, so that said first electrically insulating walls are distanced from said anisotropically conductive film in said second direction, and top surfaces of said first electrically insulating walls are not in contact with said anisotropically conductive film.

22. The module as claimed in claim 17, wherein said anisotropically conductive film extends entirely in said first and second directions, and top surfaces of said first electrically insulating walls are in contact with said anisotropically conductive film.

23. The module as claimed in claim 17, wherein each of said first electrically insulating walls is distanced from confronting side edges of adjacent two of said lead terminals.

24. The module as claimed in claim 17, wherein each of said first electrically insulating walls is in contact with confronting side edges of adjacent two of said lead terminals.

25. The module as claimed in claim 17, wherein said first electrically insulating walls comprise dry resist films.

26. The module as claimed in claim 17, wherein said first electrically insulating walls comprise a solidified-paste insulating material.

27. The module as claimed in claim 17, further comprising a plurality of second electrically insulating walls provided on said substrate and positioned in selected gaps between said electrode terminals, wherein said selected gaps between said electrode terminals are different from confronting gaps to said first electrically insulating walls, and said second electrically insulating walls have a second height, which is higher than a third total height of said electrode terminals and said anisotropically conductive film.

28. The module as claimed in claim 27, wherein said second height of said second electrically insulating walls is lower than a second total height of said electrode terminals, said lead terminals and said anisotropically conductive film, so that a top surface of said second electrically insulating wall is not in contact with said surface of said circuit board.

29. The module as claimed in claim 27, wherein each of said second electrically insulating walls is distanced from confronting side edges of adjacent two of said electrode terminals.

30. The module as claimed in claim 27, wherein each of said second electrically insulating walls is in contact with confronting side edges of adjacent two of said electrode terminals.

31. The module as claimed in claim 27, wherein said second electrically insulating walls comprise dry resist films.

32. The module as claimed in claim 27, wherein said second electrically insulating walls comprise a solidified-paste insulating material.

* * * * *